United States Patent
Morrish

(10) Patent No.: US 6,577,197 B1
(45) Date of Patent: Jun. 10, 2003

(54) HIGH FREQUENCY COMPENSATION CIRCUIT FOR HIGH FREQUENCY AMPLIFIERS

(75) Inventor: Andrew J. Morrish, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 17 days.

(21) Appl. No.: 10/011,509

(22) Filed: Nov. 6, 2001

(51) Int. Cl.⁷ ............................................. H03F 1/22
(52) U.S. Cl. ...................................... 330/292; 330/311
(58) Field of Search ................................. 330/288, 292, 330/311

(56) References Cited

U.S. PATENT DOCUMENTS

| | | | | |
|---|---|---|---|---|
| 5,469,093 A | * | 11/1995 | MacDonald | 330/311 |
| 6,028,640 A | * | 2/2000 | Nayebi et al. | 327/538 |
| 6,163,211 A | | 12/2000 | Morrish | 330/98 |
| 6,340,918 B2 | * | 1/2002 | Taylor | 330/292 |

OTHER PUBLICATIONS

"Television Engineering Handbook," K. Blair Benson, rev. by Jerry C. Whitaker, pp. 13.156–13.157 1992.
"PAL/NTSC/SECAM video decoder with adaptive PAL/NTSC comb filter, VBI–data slicer and high performance scaler SAA7114H," Phillips Semiconductors, p. 27, Mar. 15, 2000.
"VPC 323xD Comb Filter Video Processor Preliminary Data Sheet," Micronas, p. 16, Edition Jul. 26, 2001.

* cited by examiner

Primary Examiner—Robert Pascal
Assistant Examiner—Khanh Van Nguyen
(74) Attorney, Agent, or Firm—Merchant & Gould, PC; Mark R. Hennings

(57) ABSTRACT

A cascode amplifier includes a cascode input stage that provides a first current in response to an input signal. A second current is also provided in response to the input signal, where the second current is a scaled and smaller version of the first current. The second current is low-pass filtered using parasitic capacitance present in a current mirror. A delayed mirrored current is applied to the emitters of the lower cascode transistor circuit to provide negative feedback. The current mirror amplifies the effect of the parasitic capacitance in the low-pass filter. An output node of the cascode amplifier has an associated parasitic capacitance. The parasitic capacitance at the output node in the cascode amplifier is compensated for by proper arrangement of the parasitic capacitance in the current mirror, such that the cascode amplifier is useful at higher frequencies. The improved cascode amplifier is suitable for monolithic integration.

21 Claims, 3 Drawing Sheets

HIGH FREQUENCY COMPENSATION CIRCUIT FOR HIGH FREQUENCY AMPLIFIERS

FIELD OF THE INVENTION

The present invention relates to a method and apparatus for compensating high-speed class AB amplifiers. More specifically, the present invention is directed to improving the frequency response of a class AB amplifier by properly arranging a current mirror circuit to cooperate with the input stage of the amplifier.

BACKGROUND OF THE INVENTION

A two-stage amplifier includes an input stage that is connected to an output stage. The input stage provides a first stage of signal gain, while the output stage is arranged to increase power output to drive a desired load. A cascode amplifier may be employed in the input stage of the amplifier. A class AB amplifier may be used in an output stage by appropriately arranging PNP and NPN transistors.

The cascode amplifier includes a first transistor that is connected in series with a second transistor. An input signal is coupled to the base of the first transistor. The collector of the first transistor is connected to the emitter of the second transistor, where the second transistor is arranged as a cascode device. The gain of the cascode amplifier is determined by the ratio of the impedance of the emitter of the first transistor to the impedance of the collector of the second transistor. A parasitic capacitance associated with the collector of the second transistor limits the high frequency response of the cascode amplifier. The frequency response of the cascode amplifier can be extended by introducing a capacitor at the emitter of the lower cascode transistor.

SUMMARY OF THE INVENTION

The present invention relates to a method and apparatus for compensating high-speed class AB amplifiers. More specifically, the present invention is directed to improving the frequency response of a class AB amplifier stage by arranging a current mirror circuit in conjunction with the input stage of the amplifier.

Briefly stated, a method and apparatus are directed to an improved cascode amplifier. The cascode amplifier includes a cascode input stage that provides a first current in response to an input signal. A second current is also provided in response to the input signal, where the second current is a scaled and smaller version of the first current. The second current is low-pass filtered using parasitic capacitance present in a current mirror. A delayed mirrored current is applied to the emitters of the lower cascode transistor circuit to provide negative feedback. The current mirror amplifies the effect of the parasitic capacitance in the low-pass filter. An output node of the cascode amplifier has an associated parasitic capacitance. The parasitic capacitance at the output node in the cascode amplifier is compensated for by proper arrangement of the parasitic capacitance in the current mirror, such that the cascode amplifier is useful at higher frequencies. The improved cascode amplifier is suitable for monolithic integration.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a," "an," and "the" include plural references. The meaning of "in" includes "in" and "on."

The present invention is directed to a method and apparatus that improves the frequency response of a class AB amplifier by proper arranging of a current mirror circuit. The current mirror circuit is arranged to cooperate with the input stage of the amplifier, where the input stage includes an upper and lower cascode transistor circuit. The frequency response of the amplifier is extended by emulating an RC network that is coupled in parallel with an emitter resistor of the lower cascode transistor circuit. The capacitance that is required for the emulated RC network corresponds to the total parasitic capacitance of the collector of the upper cascode transistor circuit multiplied by the gain of the amplifier.

The lower cascode transistor circuit produces a first current in response to an input signal. A compensation circuit that is in accordance with the present invention includes a current mirror circuit and another lower cascode transistor. The other lower cascode transistor is arranged to provide a second current that corresponds to a scaled version of the first current. The second current is coupled to the current mirror. The parasitic capacitance in the current mirror acts as a low pass filter to the second current. The current mirror provides a third current that is corresponds to an amplified version of the low pass filtered second current. The third current is coupled to the emitter of the lower cascode transistor circuit. The effect of the capacitance in the low-pass filter is amplified, so that the parasitic capacitance of the current mirror is sufficient to provide proper compensation of the amplifier. Accordingly, the capacitors that are necessary for proper compensation of the amplifier can be provided on the same substrate as the amplifier, as in a fully integrated monolithic amplifier.

Figure 1:
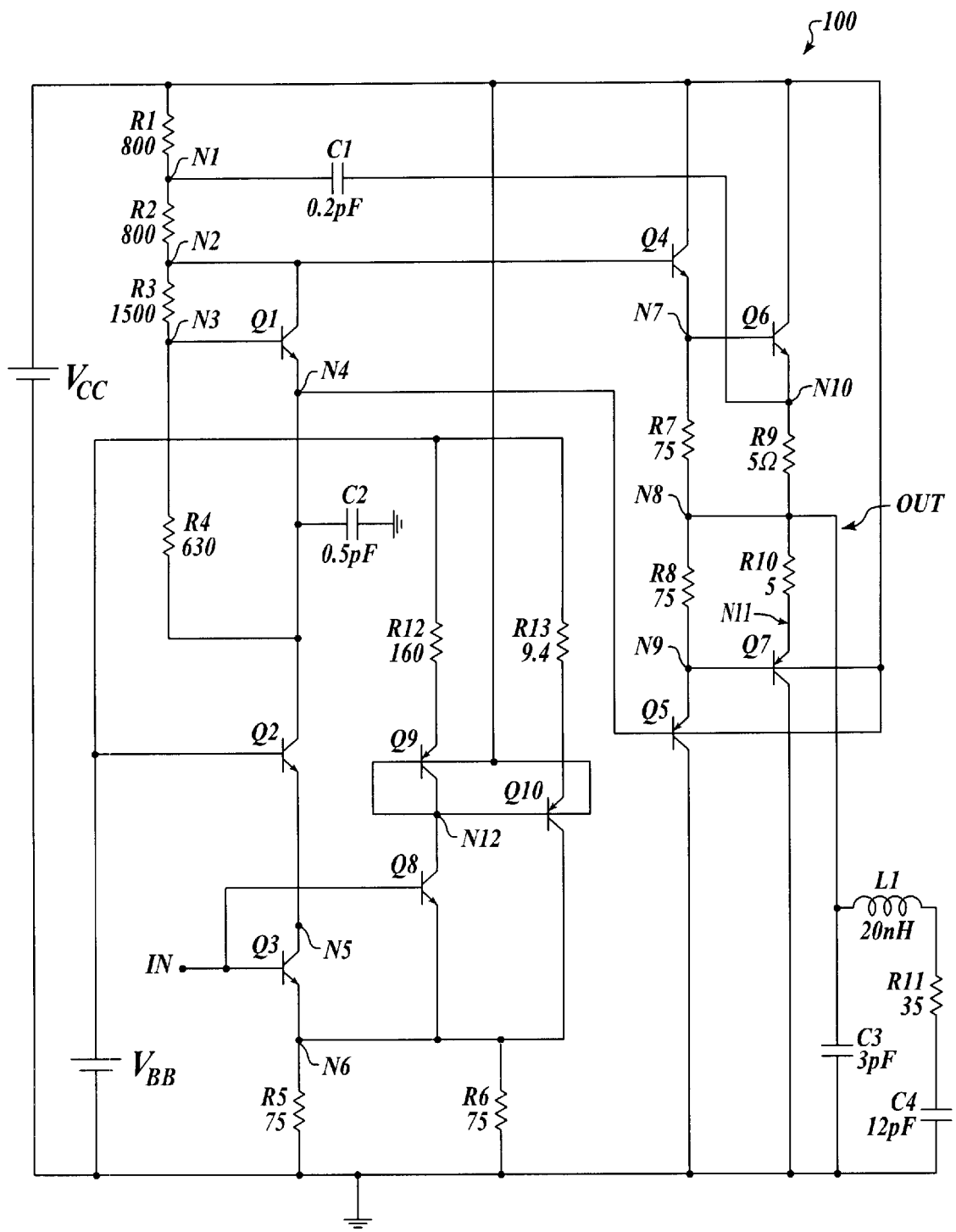
FIG. 1 is a schematic diagram of an example class AB amplifier that includes a high frequency compensation circuit.

FIG. 1 is a schematic diagram of an example class AB amplifier (100) that includes a high frequency compensation circuit that is in accordance with the present invention. The class AB amplifier (100) includes 10 transistors (Q1–Q10), 13 resistors (R1–R13), four capacitors (C1–C4), and one inductor (L1). In another example embodiment, transistors that are of a type that is complementary to the described type of each transistor may also be used in accordance with the instant invention by using voltage supplies that have an opposite polarity to those described. Vcc and Vbb are provided as voltage supplies for the amplifier.

Transistor Q1 is an NPN transistor that has a collector that is coupled to node N2, a base that is coupled to node N3, and an emitter that is coupled to node N4. Transistor Q2 is an NPN transistor that has a collector that is coupled to node N4, a base that is coupled to Vbb, and an emitter that is coupled to node N5. Transistor Q3 has a collector that is coupled to node N5, a base that is coupled to node IN, and an emitter that is coupled to node N6. Transistor Q4 is an NPN transistor that has a collector that is coupled to Vcc, a base that is coupled to node N2, and an emitter that is coupled to node N7. Transistor Q5 is a PNP transistor that has an emitter that is coupled to node N9, a base that is coupled to node N4, a collector that is coupled to ground, and a substrate that is coupled to Vcc. Transistor Q6 is an NPN transistor that has a collector coupled to Vcc, a base that is coupled to node N7, and an emitter that is coupled to node N10. Transistor Q7 is a PNP transistor that has an emitter coupled to node N11, a base that is coupled to node N9, a collector that is coupled to ground, and a substrate that is coupled to Vcc. Transistor Q8 is an NPN transistor that has a collector coupled to node N12, a base that is coupled to node IN, and an emitter that is coupled to node N6. Transistor Q9 is a PNP transistor that has an emitter that is coupled to resistor R12, a base and a collector that are coupled to node N12, and a substrate that is coupled to Vcc. Transistor Q10 is a PNP transistor that has an emitter that is coupled to resistor R13, a base that is coupled to node N12, a collector that is coupled to node N6.

Resistor R1 is coupled between Vcc and node N1. Resistor R2 is coupled between node N1 and node N2. Resistor R3 is coupled between node N2 and node N3. Resistor R4 is coupled between node N3 and node N4. Resistor R5 is coupled between node N6 and ground. Resistor R6 is coupled between node N6 and ground. Resistor R5 and R6 may be implemented as a single, monolithic resistor having the equivalent parallel resistance of resistor R5 in parallel with resistor R6. Resistor R7 is coupled between node N7 and node N8. Resistor R8 is coupled between node N8 and node N9. Resistor R9 is coupled between node N10 and node N8. Resistor R10 is coupled between node N8 and node N11. Resistor R11 is coupled between the inductor L1 and capacitor C4. Resistor R12 is coupled between Vbb and the emitter of transistor Q9. Resistor R13 is coupled between Vbb and the emitter of transistor Q10. Capacitor C1 is coupled between node N1 and node N10. Capacitor C2 is shown for the purpose of representing stray capacitance between node N4 and ground. Capacitor C3 is coupled between node N8 and ground. Capacitor C4 is coupled between resistor R11 and ground. The inductor L1 is coupled between node N8 and resistor R11.

The amplifier of FIG. 1 includes a diode multiplier circuit, a cascode input stage, a class AB output stage, and a current mirror circuit. The diode multiplier circuit includes transistor Q1, load resistors R1 and R2, a resistor network that contains resistors R3 and R4, and capacitor C1. The cascode input stage includes transistors Q2, Q3, and Q8 emitter resistors R5 and R6, and capacitor C2. The class AB output stage includes transistors Q4–Q7, resistors R7–R11, capacitors C3 and C4, and inductor L1. The current mirror circuit includes transistors Q9–Q10 and resistors R12–R13. The association of the components with a named portion of the circuit is only given for the purpose of convenient reference in this discussion. Thus, the association of the components with the named portions of the circuit does not limit the operation or association of the components to those named portions.

The cascode input stage is arranged to provide a cascode operating current in response to an input signal that is applied to the IN node. A first impedance is determined by the emitter impedance of lower cascode transistor Q3, resistor R5, and resistor R6. A second impedance is determined by the collector impedance of upper cascode transistor Q2, resistor R1, and resistor R2. The low frequency gain of the amplifier is determined by the ratio of the first and second impedance.

The diode multiplier circuit sources the cascode operating current to upper cascode transistor Q2. The first and second load resistors (R1 and R2) limit the cascode operating current. The load resistors are bootstrapped by capacitor C1 in order to minimize the rise time of the cascode operating current. A parasitic capacitance (which is represented by capacitor C2) is present at node N4. Parasitic capacitor C2 is a lumped capacitance that includes all of the parasitic capacitances in the circuit that are present at node N4. Parasitic capacitance C2 is primarily due to the parasitic capacitance from the collector of upper cascode transistor Q2. Other capacitances from other devices and structures present at the upper cascode transistor collector node (node N4) also contribute to parasitic capacitance C2.

The lower cascode transistors are shown as transistors Q3 and Q8 and have similar electrical characteristics. The lower cascode transistors may be implemented as two separate, parallel devices or as a monolithic device sharing a base-emitter structure with two separate collectors. Accordingly the base-emitter voltages of transistors Q3 and Q8 are identical and the collector currents are determined by the relative sizes of the transistors. In an example cascode input stage, transistor Q8 is sized so that the collector current of transistor Q8 is about ten times smaller than the collector current of transistor Q3. The collector current of transistor Q8 is applied to the current mirror circuitry for filtering and amplification.

The current mirror circuitry is arranged as a PNP current mirror that comprises transistors Q9 and Q10. Transistors Q9 and Q10 are electrically similar devices that have their bases coupled together. The magnitude of the collector current that is mirrored between the transistors is determined by the ratio of relative sizes of transistors Q9 and Q10. The emitter resistors (R12 and R13) are matched to the sizes of transistors Q9 and Q10 (respectively) and are used to control the ratio of the current mirror. The emitter resistors R12 and R13 also control the amplification of the voltage applied to the base of transistor Q10. The area of the emitter resistors is chosen in accordance with the size of the transistor to which the emitter resistor is coupled. The relative sizing of the emitter resistors helps to insure that the base-emitter voltages of transistors Q9 and Q10 are closely matched such that the relative collector currents are mirrored in the correct ratio. In an example current mirror, the components of the current mirror are sized so that the collector current of transistor Q10 is about ten times greater than the collector current of transistor Q9.

An RC time constant is associated with the parasitic capacitances at node N12 and the comparatively high resistance of resistor R12. The total parasitic capacitance at node N9 is largely due to the parasitic capacitance from the collectors of transistors Q8 and Q9. Additional capacitance may be added to the base of transistor Q10 if necessary to improve the performance of the RC network. Resistor R12 and the parasitic capacitance at node N12 are arranged to operate as a low-pass filter. The low-pass filter receives the signal from the collector of transistor Q8 and delays the response time of the current mirror to the signal. The collector response of transistor Q8 is applied to the base of the second mirror transistor Q10, which amplifies the emitter current flowing in the first mirror transistor Q9. The current mirror is arranged to provide the mirrored current to the emitters of the lower cascode transistors Q3 and Q8 at node N6. The voltage at node N6 will increase when the current through resistors R5 and R6 increase in response to an increase in the input signal applied at the IN terminal. Thus, the base-emitter voltage of transistors Q3 and Q8 will decrease as a result of the increased current from the current mirror circuit, operating as a negative feedback loop.

The diode multiplier is arranged to maintain the collector of transistor Q2 of the cascode stage at a predetermined voltage and to provide a temperature compensated bias current for the output stage. The class AB output stage is arranged to provide an output signal in response to the cascode operating current. Transistors Q4 and Q5 provide class A amplification, while transistors Q6 and Q7 provide class B amplification. The stability of the amplifier at high operating frequencies is increased by using capacitor C1 to couple feedback from an output stage transistor Q6 to node N1 of the diode multiplier. The amplifier may be implemented in an integrated circuit, although other implementations are possible.

The amplifier of FIG. 1 is a high-speed cascode class AB amplifier that is capable of driving a highly capacitive or resistive load. Typically Vcc provides a supply voltage in a range of around 65–85 V, while Vbb provides a bias voltage in a range of around 8–12 V. An analog input signal that is usually in the range of 0.5 V–3 V is applied to the input (node IN) of the amplifier. The amplifier amplifies the input signal and provides an output signal at the output (OUT, node N8). The output signal is capable of driving, for example, high capacitive loads such as the cathode of a CRT. Inductor L1, resistor R11, and capacitors C3–C4 are arranged to operate as a simulated load.

In operation, an increase in the input signal (applied at node IN) causes the collector currents of lower cascode transistors Q3 and Q8 to increase. The increase in the collector currents of transistors Q3 and Q8 causes the collector current of the upper cascode transistor Q2 to increase. The increase in the collector current of cascode transistor Q2 causes the collector current of the diode multiplier transistor Q1 and the current through load resistors R1 and R2 to increase. As the current through load resistors R1 and R2 increases, the potentials of nodes N1 and N2 decrease, which causes the emitter voltages of transistors Q4–Q7 to decrease and the potential at node OUT to decrease.

The increase in the collector current of transistor Q8 is similar to the increase of the collector current of transistor Q3. The increasing collector current of NPN transistor Q8 is applied to the RC time constant structure present at node N9 where the increasing current is low-pass filtered and delayed. PNP transistor Q10 of the current mirror circuitry mirrors and amplifies the filtered and delayed increase in its collector current. The collector current of transistor Q10 (which embodies the amplified filtered and delayed increase) is applied in a negative feedback loop to the emitters of transistors Q3 and Q8. The negative feedback loop emphasizes the high frequency components of the original signal and increases the responsiveness of transistors Q3 and Q8 to the original input signal.

Similarly, a decrease in the input signal (applied at node IN) causes the collector currents of lower cascode transistors Q3 and Q8 to decrease. The decrease in the collector currents of transistors Q3 and Q8 causes the collector current of the upper cascode transistor Q2 to decrease. The decrease in the collector current of cascode transistor Q2 causes the collector current of the diode multiplier transistor Q1 and the current through load resistors R1 and R2 to decrease. As the current through load resistors R1 and R2 decreases, the potentials of nodes N1 and N2 increase, which causes the emitter voltages of transistors Q4–Q7 to increase and the potential at node OUT to increase.

The decrease in the collector current of transistor Q8 is similar to the decrease of the collector current of transistor Q3. The decreasing collector current of NPN transistor Q8 is applied to the RC time constant structure present at node N9 where the decrease is low-pass filtered and delayed. PNP transistor Q10 of the current mirror circuitry mirrors and amplifies the filtered and delayed decrease in its collector current. The collector current of transistor Q10 (which embodies the amplified filtered and delayed decrease) is applied in a negative feedback loop to the emitters of transistors Q3 and Q8. The negative feedback loop emphasizes the high frequency components of the original signal and increases the responsiveness of transistors Q3 and Q8 to the original input signal.

Frequency response characteristics of the compensation circuit can be "tuned" (i.e., controlled) by varying Vbb. Junction capacitance of a semiconductor device is a function of the supply voltage. Varying Vbb from, for example, 8 volts to 12 volts causes the parasitic capacitance of transistors Q8, Q9, and Q10 to vary appreciatively. The change in the parasitic capacitance of transistors Q8, Q9, and Q10 affects the response characteristics of the amplifier. Accordingly, the characteristics of the amplifier (such as overshoot, rise time, fall time, and the like) can be controlled through manipulating Vbb. Vbb can be manipulated through a DC control voltage, which can be readily implemented using a potentiometer, a DAC, or the like.

Figure 2:
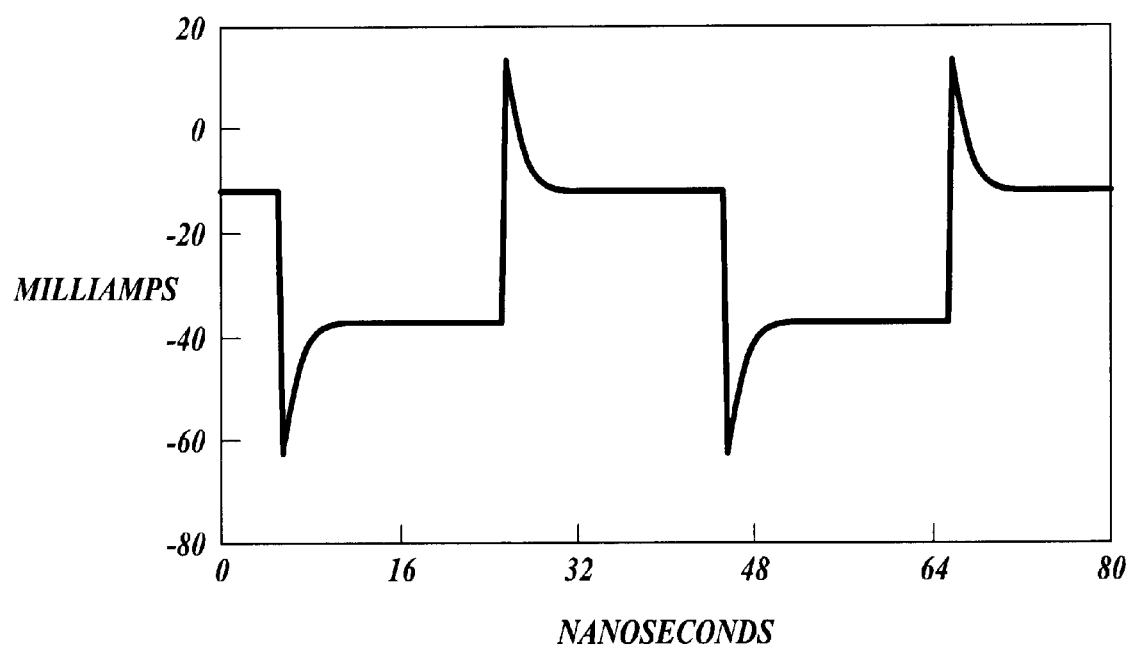
FIG. 2 is a graph displaying the emitter current trace of an example lower cascode transistor Q3 illustrated in FIG. 1.

FIG. 2 is a graph illustrating the emitter current of an example lower cascode transistor Q3 that is in accordance with the present invention. The emitter current of transistor Q3 includes current spikes as a result of a square wave signal that is applied to the input terminal (IN). The decay in the emitter current of transistor Q3 is due to the current mirror increasing the emitter voltage of transistor Q3 in accordance with the RC time constant discussed above. The edges of the current are fast due to the delayed response time of the current mirror. The emitter current of transistor Q8 is similar in form.

Figure 3:
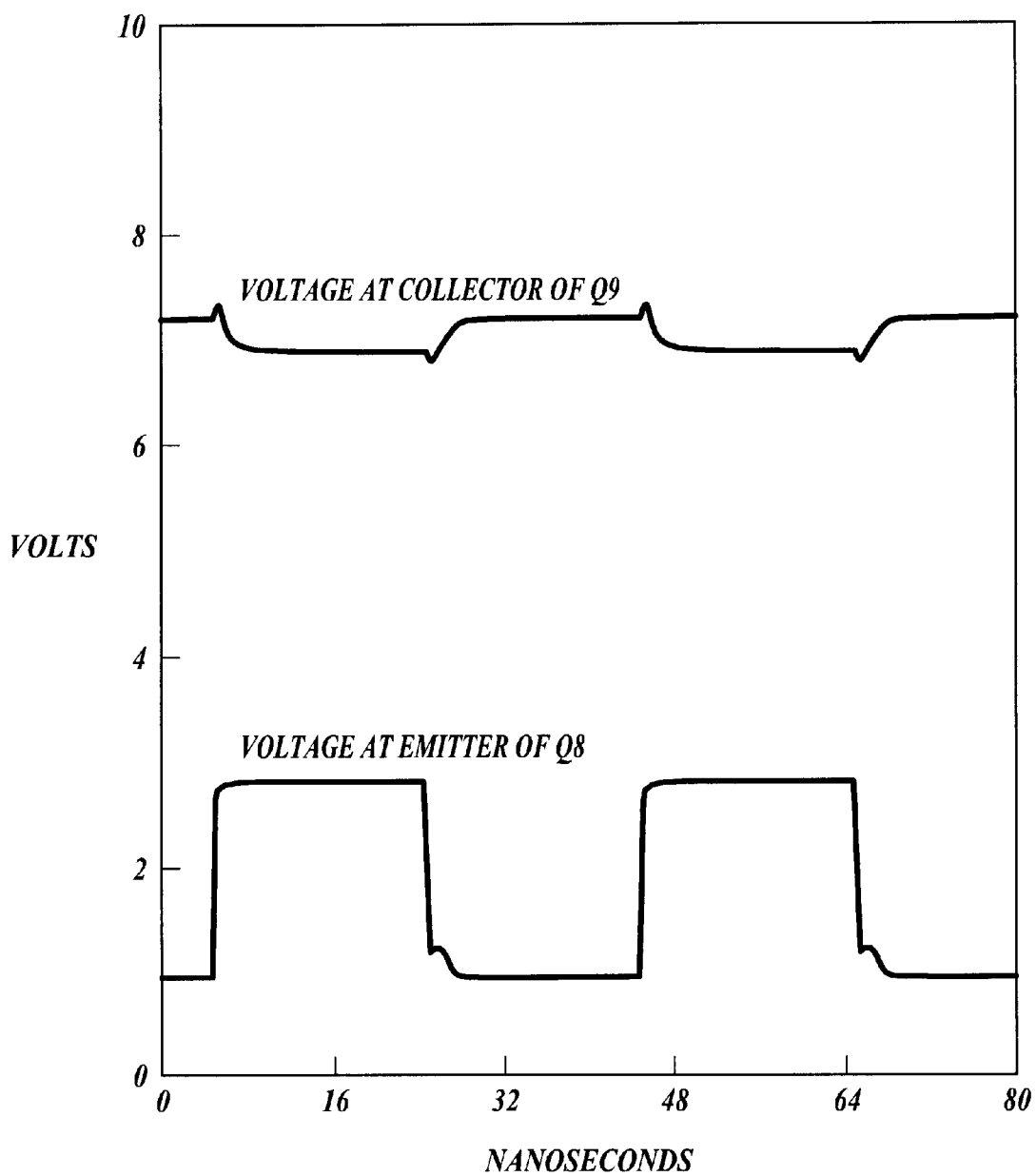
FIG. 3 is a graph displaying the emitter voltage trace of an example second lower cascode transistor Q8, and the collector voltage trace of an example first mirror transistor Q8, in accordance with the present invention.

FIG. 3 is a graph illustrating the emitter voltage of an example second lower cascode transistor Q8 and the collector voltage of an example first mirror transistor Q8 that are in accordance with the present invention. The collector voltage of transistor Q9 lags the emitter voltage of transistor Q8 due to the parasitic capacitance that is present at node N12 and the comparatively large resistance of resistor R12.

Although the above-described circuit is arranged to increase the frequency response of a class AB amplifier, the high frequency compensation circuit may be used in other electronic circuits that employ a cascode amplifier stage. In one example, the high frequency compensation circuit is used with a class A amplifier. In another example, the high frequency compensation circuit is used with a push-pull output driver. In yet another example, the high frequency compensation circuit is used with a class B amplifier. When employed in an integrated circuit, the high frequency compensation circuit allows cost savings by decreasing the size of the capacitor required for the lower RC network. Although the current mirror circuit is described with two transistors, other implementations may include more or less transistors and devices that are arranged provide a similar function.

When employed in an integrated circuit, the transistors of the high frequency compensation circuit are thermally coupled. Thermal coupling may also be accomplished, for example, by situating discrete transistors in similar thermal environments. When the transistors are thermally coupled, the relative electrical performance of the transistors track one another across the temperature operating range for those transistors. Temperature compensation provides consistent amounts of compensation when operating over a wide range of temperatures. Similarly, the effects of process variations that occur in manufacturing integrated circuits (or discrete components made in lots) are minimized. The electrical characteristics of integrated transistors (or transistors from the same manufacturing lot) that are employed in the high frequency compensation circuit scale evenly due to the process variations. Accordingly, the high frequency compensation circuit provides effective compensation despite the process variations that occur in manufacturing the devices used in the circuit.

An example of process dependent tracking is illustrated as follows below with reference to FIG. 1.

The lumped parasitic capacitance at node N4 is predominately due to the collector-substrate capacitance of transistor Q2. Also, the lumped parasitic capacitance at node N12 is predominately due to the collector-substrate capacitance of transistor Q8 and Q9. Thus, when the process variations increase the lumped parasitic capacitance at node N4, the lumped parasitic capacitance at node N12 will also increase. During operation, the increased lumped parasitic capacitance at node N4 will slow down the speed of the cascode amplifier. Since the lumped parasitic capacitance at node N12 has also increased, the current mirror arrangement will have a slow responsiveness, which will delay the negative feedback and permit the cascode amplifier to run faster. Similar performance merits are found with thermal activity.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A method for providing improved compensation of a cascode amplifier, comprising the steps of:
producing a first current in response to an input signal, wherein the first current has an associated magnitude;
producing a second current in response to the input signal, wherein the second current is related to the first current by a ratio that is less than one such that the second current is less than the first current;
applying the second current to an input of a current mirror, wherein the current mirror has an associated time constant such that the current mirror responds to the second current after a delay time associated with the time constant;
amplifying the delayed second current to produce a third current, wherein the third current corresponds to an amplified version of the delayed second current; and
coupling the third current to the cascode amplifier such that the cascode amplifier is stable.

2. The method of claim 1, further comprising:
combining the first current with the third current to produce a fourth current; and
producing an emitter voltage in the cascode amplifier in response to the fourth current such that cascode amplifier includes negative feedback compensation.

3. The method of claim 1 wherein the time constant is approximately equal to another time constant, and the other time constant corresponds to a capacitance that is associated with an output of the cascode amplifier.

4. The method of claim 1, further comprising: coupling a resistance to the current mirror such that the time constant is related to the resistance and a parasitic capacitance that is associated with the input of the current mirror.

5. The method of claim 1, further comprising:
varying a supply voltage of the cascode amplifier such that a frequency response characteristic of the cascode amplifier is changed.

6. The method of claim 1, further comprising:
arranging a first transistor and a second transistor in a common base configuration, wherein the first transistor is part of the cascode amplifier and the second transistor is part of a compensation circuit; and
arranging the first transistor and the second transistor in a common emitter configuration, such that the first transistor produces the first current and the second transistor produces the second current.

7. The method of claim 6, further comprising: thermally coupling the first transistor to the second transistor.

8. The method of claim 6, wherein the first transistor and the second transistor are on a common substrate.

9. A cascode amplifier, comprising:
a means for producing a first current that is arranged to produce a first current in response to an input signal;
a means for producing a second current that is arranged to produce a second current in response to the input signal, wherein the second current is related to the first current by a ratio that is less than one such that the second current is less than the first current;
a means for filtering that is arranged to low pass filter the second current and provide a control signal;
a means for mirroring that is arranged to provide a third current in response to the control signal such that the third current corresponds to a scaled version of the second current after filtering; and
a means for coupling the third current to the cascode amplifier such that the cascode amplifier is stable.

10. A cascode amplifier as in claim 9, further comprising:
a means for combining the first current with the third current to produce a fourth current; and
a means for producing an emitter voltage in the cascode amplifier in response to the fourth current such that cascode amplifier includes negative feedback compensation.

11. The cascode amplifier of claim 9, wherein the cascode amplifier has an associated gain, the cascode amplifier includes a capacitance that is associated with an output of the cascode amplifier, and the means for low pass filtering has an associated capacitance that is related to the capacitance of the output and the associated gain of the cascode amplifier.

12. The cascode amplifier of claim 9, wherein the means for filtering includes a resistor circuit that is coupled to the means for mirroring, and a parasitic capacitance, wherein the parasitic capacitance is associated with an input of the means for mirroring, such that a characteristic of the means for filtering is determined by the resistor circuit and the parasitic capacitance.

13. The cascode amplifier of claim 9, wherein: the means for producing the first current includes a first transistor, the means for producing the second current includes a second transistor, the first transistor is arranged in a common-emitter configuration with respect to the second transistor, and the first transistor is arranged in a common base configuration with respect to the second transistor, such that the first transistor produces the first current and the second transistor produces the second current.

14. The cascode amplifier of claim 13, wherein the first transistor and the second transistor are on a common substrate.

15. The cascode amplifier of claim 13, wherein the first transistor is thermally coupled to the second transistor.

16. A cascode amplifier circuit, comprising:
   a lower cascode transistor circuit that is configured to provide a first current and a second current in response to an input signal, wherein the first current is greater than the second current, and the second current is related to the first current by a ratio;
   an upper cascode transistor circuit that is configured to provide an output signal at an output node in response to the first current;
   a current mirror circuit that is configured to receive the second current and provide a third current that is greater than the second current, and the third current is related to the second current by another ratio, wherein the current mirror includes a parasitic capacitance that delays the responsiveness of the current mirror to the second current; and
   a resistance circuit that is coupled to the lower cascode transistor circuit and configured to combine the first current and the third current.

17. The cascode amplifier of claim 16, wherein the resistance circuit is arranged to provide negative feedback to stabilize the cascode amplifier.

18. The cascode amplifier of claim 16, wherein the parasitic capacitance in the current mirror circuit is arranged to operate as a low-pass filter.

19. The cascode amplifier of claim 16, wherein a capacitance circuit is coupled to the parasitic capacitance in the current mirror to reduce the responsiveness of the current mirror.

20. The cascode amplifier of claim 16, wherein the lower cascode transistor circuit has a common-emitter node that is coupled to the resistance circuit, and a common base node that is configured to receive the input signal.

21. The cascode amplifier of claim 16, wherein the lower cascode transistor circuit comprises a first lower cascode transistor and a second lower cascode transistor that are arranged in a common-base and common-emitter configuration.

* * * * *